United States Patent [19]

Tsunashima et al.

[11] Patent Number: 5,173,440

[45] Date of Patent: Dec. 22, 1992

[54] METHOD OF FABRICATING A SEMICONDUCTOR DEVICE BY REDUCING THE IMPURITIES

[75] Inventors: Yoshitaka Tsunashima, Inagi; Kenji Todori; Kikuo Yamabe, both of Yokohama, all of Japan

[73] Assignee: Kabushiki Kaisha Toshiba, Kawasaki, Japan

[21] Appl. No.: 517,331

[22] Filed: May 1, 1990

[30] Foreign Application Priority Data

May 2, 1989 [JP] Japan ................................. 1-113024
Aug. 7, 1989 [JP] Japan ................................. 1-202883
Dec. 12, 1989 [JP] Japan ................................. 1-320654

[51] Int. Cl.$^5$ .......................................... H01L 21/225
[52] U.S. Cl. ................................... 437/164; 437/151; 437/247; 148/DIG. 14
[58] Field of Search ............... 437/164, 152, 154, 145, 437/247, 160, 919, 161, 150, 151; 148/DIG. 40, DIG. 141, DIG. 14

[56] References Cited

U.S. PATENT DOCUMENTS

| | | | |
|---|---|---|---|
| 3,614,829 | 10/1971 | Burgess et al. | 437/164 |
| 3,832,247 | 8/1974 | Saddler et al. | 437/164 |
| 4,433,008 | 2/1984 | Schnable et al. | 437/164 |
| 4,549,914 | 10/1985 | Oh | 437/160 |
| 4,597,824 | 7/1986 | Shinada et al. | 437/164 |
| 4,755,486 | 7/1988 | Treichel et al. | 437/164 |
| 4,889,492 | 12/1989 | Barden et al. | 437/164 |

FOREIGN PATENT DOCUMENTS 0154344 12/1977 Japan.
0164537 12/1981 Japan.

OTHER PUBLICATIONS

English translation of Japanese document #52-154344, made of record in paper #8, Aug. 2, 1991.
Saraswat et al., "A New Bipolar Process-Borsenic", IEEE J. of Sol. St. Cir., vol SC-11, No. 4, Aug. 1976.
Arai et al., "Structural [sic] Changes of Arsenic Silicate Glasses with Heat Treatments", Japanese Journal of Applied Physics, vol. 9, No. 6, Jun. 1970, pp. 691-704.

Primary Examiner—Brian E. Hearn
Assistant Examiner—C. Chaudhari
Attorney, Agent, or Firm—Finnegan, Henderson, Farabow, Garrett and Dunner

[57] ABSTRACT

In fabricating a semiconductor device, when impurities are diffused from a silicon oxide layer containing the impurities to a semiconductor layer, a diffusion atmosphere is controlled so as to oxidize or reduce a specified impurity to thereby control the diffusion coefficient of the impurities in the silicon oxide layer. Thus, it is possible to form a diffusion layer having a desired impurity profile under a good control.

17 Claims, 9 Drawing Sheets

METHOD OF FABRICATING A SEMICONDUCTOR DEVICE BY REDUCING THE IMPURITIES

TECHNICAL FIELD OF THE INVENTION

The present invention relates to a method of fabricating a semiconductor device and more particularly to a method of introducing impurities during the fabrication of the semiconductor device.

BACKGROUND ART

Recently, in a semiconductor integrated circuit, the components of the circuit have been extremely miniaturized and densely integrated. And now it appears to be almost impossible to achieve further miniaturization of the components. Thus, to improve the performance and the reliability of highly integrated circuits, it becomes necessary to take measures other than further miniaturization of the components. In order to cope with this situation, technologies of forming grooves on the surface of a semiconductor substrate, and laminating a semiconductor layer, an insulating layer, a metal layer, etc., in a three-dimensional structure have been developed.

For example, in a MOS capacitor which is a component of a dynamic RAM (DRAM), a method has been studied which provides grooves on a surface of a silicon substrate and forms capacitors in the grooves in order to increase the capacity of the capacitors without increasing an area occupied by the capacitors. However, in order to increase the reliability to protect against the breakage of the capacitors due to their aging, it is required to make the potential of the upper electrode at 0 or 5 volt for the purpose of discriminating the contents of the memory. Therefore, it has been employed a method which forms on a surface of the silicon substrate an impurity diffusion layer having a density of $10 \times 10^{18}$ cm$^{-3}$ and a conductive type opposite to the substrate.

On the other hand, since multiple cells are arranged in a DRAM, there is the problem that a separation withstand voltage between the impurity diffusion layers of the capacitors formed in the grooves is lowered as the distance between the grooves is reduced in the formation of high density components.

For example, let us suppose that an n-type impurity diffusion layer is formed on a groove surface of a p-type substrate. In order to solve the above-mentioned problem, a method is employed which includes the steps of forming a p-type impurity diffusion layer slightly higher in density than the substrate underlying the impurity diffusion layer on the groove surface to provide a double diffusion layer or a so-called HIC structure. The HIC structure is known to have an excellent soft error preventing characteristic even when the capacity of the capacitors reduced.

However, it is very difficult to form a double diffusion layer on the surface of the grooves with high accuracy. For example, the ion implantation process which is a generally known doping technique cannot provide a uniform density of impurities into the bottom and side walls in the groove. To provide a uniform density of impurities into the bottom and side walls in the groove, a so-called doped glass, i.e., a silicon oxide film containing impurities may be used. However, for the impurities contained in the doped glass to diffuse out of the glass to form a diffusion layer, it is necessary to perform the steps of film (doped glass) formation, impurity diffusion and film separation for each kind of impurity to be diffused, thus increasing the number of steps greatly.

It appears that it is possible to reduce the number of the steps when a doped glass containing plural kinds of impurities is used. However, in the current level of techniques it is very difficult to control the diffusion of the plural kinds of impurities from the doped glass so as to obtain a desired profile of the diffused impurities. Therefore, this technique has not yet been put into practical use.

In fact, not only the impurity diffusion technique using doped glass containing plural kinds of impurities as mentioned above, but also techniques of diffusing impurities from a doped glass of any type have been regarded as being impractical because they cannot satisfactorily control the diffusion of impurities.

Therefore, it has been regarded as impossible to form a semiconductor device having a double diffusion layer on the groove surface. In fact, it has been practically impossible to form a double diffusion layer of a desired construction on the groove surface.

Further, not limited to the example of DRAM as described above, techniques of diffusing impurities from a silicon oxide film containing a plurality of kinds of impurities are regarded as impractical because of lacking controllability of impurity diffusion.

The technique of diffusing a single kind of impurity has the following problems. One problem lies in the control of the depth of the impurity diffusion layer. The depth of the impurity diffusion layer must be shallow to miniaturize the components of the device. However, it is very difficult to achieve a shallow implantation of impurities at a relatively high density.

For example, in a doped oxide method which diffuses boron, generally used as p-type impurities, into a silicon substrate using as the diffusion source a boron containing glass layer (BSG), the diffusion coefficient in the glass layer is smaller by one hundredth or more compared to the diffusion coefficient in the silicon substrate. Therefore, in many cases, the speed of such impurity diffusion is determined by that of impurities in the glass layer.

Therefore, if boron impurities of high density, for example of $10^{20}$ cm$^{-3}$, are introduced into the silicon substrate, diffusion must be performed in an atmosphere of a relatively high temperature higher than 1000° C., using a BSG film containing boron at a density higher than $10^{20}$ cm$^{-3}$. In such diffusion, it is necessary to move slowly a wafer into or out of the diffusion furnace in order to suppress stresses in the wafer. During the slow movement of the wafer, the impurities are diffused substantially, and the area into which the impurities are introduced expands undesirably. Thus, it is very difficult to form a shallow impurity diffusion layer.

There is a method of thermally diffusing impurities in a short time. This method uses a lamp heating furnace and is able to provide a shallow impurity layer. However, there is a disadvantage that the quality of products vary and it is difficult to constantly obtain desired impurity layers. Therefore, the yield is lowered.

SUMMARY OF THE INVENTION

The present invention is made in view of the above situation, and it is an object of the present invention to provide a method of forming a diffusion layer easily under good control of impurity diffusion when impurities are diffused from a silicon oxide layer to a semiconductor layer.

In order to achieve the object, according to the present invention, a diffusion atmosphere is controlled such that specified impurities are oxidized or reduced to thereby control the diffusion coefficient of the impurities in the silicon oxide layer when the impurities are diffused from the silicon oxide layer containing the impurities into the semiconductor layer.

A doped glass used as a source of diffusion is usually formed using CVD or so-called spin-on-glass (SOG) process. The impurities contained in the glass assume various chemical states depending on methods and requirements for forming the doped glass. The chemical states of the dopant impurities will greatly influence the diffusing behavior of the dopants in the glass.

An experiment was conducted with respect to arsenic used as dopant impurities to study the diffusing behavior of the arsenic in the doped glass. As a result, it was observed that the arsenic impurities were diffused at a very high speed in doped glass in the oxidized state where arsenic impurities were combined with oxygen atoms in the silicon oxide network, whereas in the reduced state of arsenic impurities where the arsenic impurities were combined with hydrogen atoms in the silicon oxide network, the diffusion of arsenic impurities in the doped glass was greatly retarded. A similar phenomenon was observed with respect to dopant impurities other than arsenic.

The present invention has been made in utilizing this phenomenon. According to the present invention, a diffusion atmosphere during thermal treatment is controlled such that the chemical state of the dopants in doped glass is fixed to one state or otherwise changed to another state to control the behavior of the diffusion to thereby introduce the dopants in the semiconductor layer under the good control of the diffusion.

When doped glass containing a plurality of kinds of impurities is used, a diffusion atmosphere is selected such that only the diffusion of specified kinds of dopant impurities is expedited while the diffusion of the remaining dopant impurities is suppressed.

By changing the diffusion atmosphere in the course of thermal treatment, the diffusion of a specified dopant is expedited for a certain time interval and thereafter is suppressed for another certain time interval and vice versa, thereby forming a diffusion layer having a specified profile of density.

Preferably, the diffusion atmosphere contains 2-60% of hydrogen for the purpose of reducing impurities.

By employing such diffusion atmosphere, the coefficient of impurity diffusion in a film containing impurities and a coefficient of segregation at the interface of the film containing impurities and the semiconductor layer are increased to thereby perform a good control of the diffusion profile, which enables, for example, a reduction of the depth of the diffusion.

DETAILED DESCRIPTION OF THE INVENTION

Embodiments of the present invention will be described hereinafter in detail with reference to the drawings.

FIGS. 1(a)-1(d) are procedural cross-sectional views illustrating the steps of forming very thin $n^+$- and $n^-$-type diffusion layers working as source and drain regions of a MOSFET according to an embodiment of the present invention.

Figure 1:
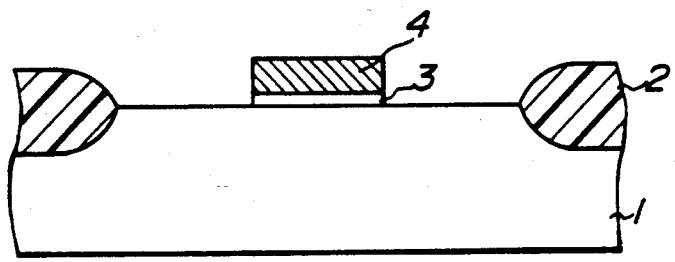
FIGS. 1(a)-1(d) illustrate the steps of fabricating a MOSFET according to an embodiment of the present invention.
Figure 1:
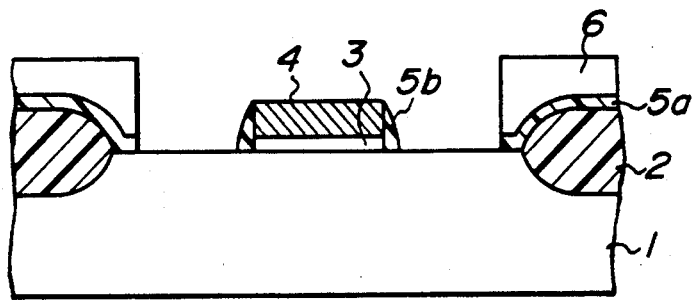
Figure 1:
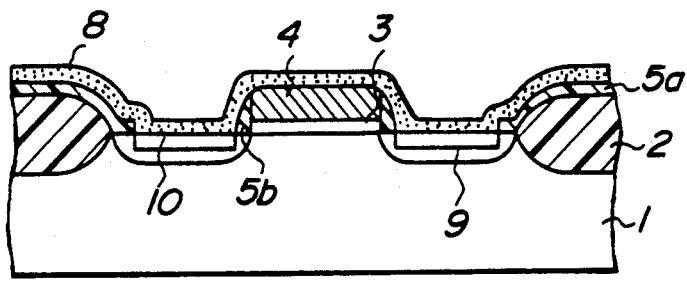
Figure 1:
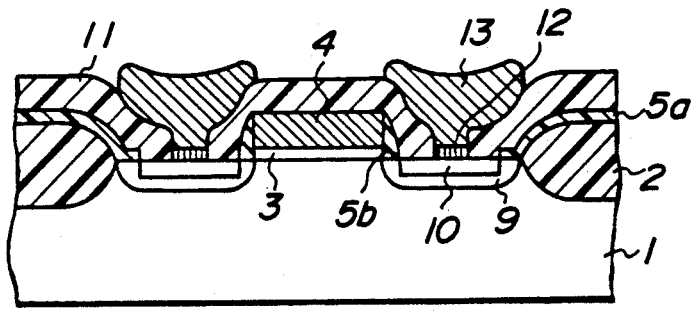

As shown in FIG. 1(a), an element separating insulating film 2 is formed in a p-type (100) silicon substrate of a resistivity of 10 $\Omega$·cm by using conventional LOCOS process. Then, a silicon oxide layer of a thickness of 10 nm and a polycrystalline silicon film of a thickness of 300 nm are deposited. The resulting half-finished product is patterned using photolithography and reactive ion etching process to form a gate insulating film 3 and a gate electrode 4.

Thereafter, as shown in FIG. 1(b), a silicon nitride film is formed on the entire surface of the substrate and then a resist film is coated thereon. Thereafter, a generally known patterning process is conducted in which the resist film 6 is left as an etching mask in the element separating region. The silicon nitride film except for the silicon nitride film 5a covered with the resist film and the silicon nitride film 5b on the gate electrode side wall portion is etched away by the reactive ion etching process.

The resist film 6 is then etched away, and doped glass 8 of a thickness of 100 nm and to which arsenic of a density of $6\times10^{20}$ cm$^{-3}$ is deposited using LPCVD (Low Pressure Chemical Vapor Deposition). As shown in FIG. 1(c), a heater including a lamp is used to thermally treat the resulting product for 60 minutes in a nitrogen atmosphere containing 10% of hydrogen at a temperature of 1000° C. RTA (Rapid Thermal Annealing) is conducted at 1200° C. for 2 minutes in a 100%-nitrogen atmosphere to diffuse arsenic impurities very shallowly from the doped glass 8 into the silicon substrate to form the source and drain regions of a DDD (Double Diffused Drain) structure comprising n⁻- and n⁺-diffusion layers 9 and 10. Thermal treatment is conducted in a reducing atmosphere at a slightly low temperature for a long time to suppress the diffusion of arsenic from the doped glass 8 to thereby form an n⁻-diffusion layer 9 in which arsenic impurities are diffused slightly deep at a low density. Thereafter, high temperature thermal treatment where the solid solution density of arsenic in the silicon substrate is high is used to form a high arsenic density diffusion layer on the surface of the silicon layer to thereby result in a deeper relatively low density n⁻-diffusion layer 9 with arsenic density of $1 \times 10^{18}$ cm$^{-3}$ and an arsenic diffusion depth of 0.1 μm and a shallow high density n⁺-diffusion layer 10 with an arsenic diffusion depth of 0.07 μm and arsenic density of $1 \times 10^{20}$ cm$^{-3}$, laminated so as to provide a step-like density profile.

Thereafter, doped glass 8 to which arsenic is added is etched away using a diluted hydrofluoric acid, an interlayer insulating film 11 is deposited and a contact hole for wiring is formed.

Thereafter, as shown in FIG. 1(d), a barrier metal 12 and a lead 13 are formed using conventional methods to thereby complete a MOS transistor.

Figure 2A:
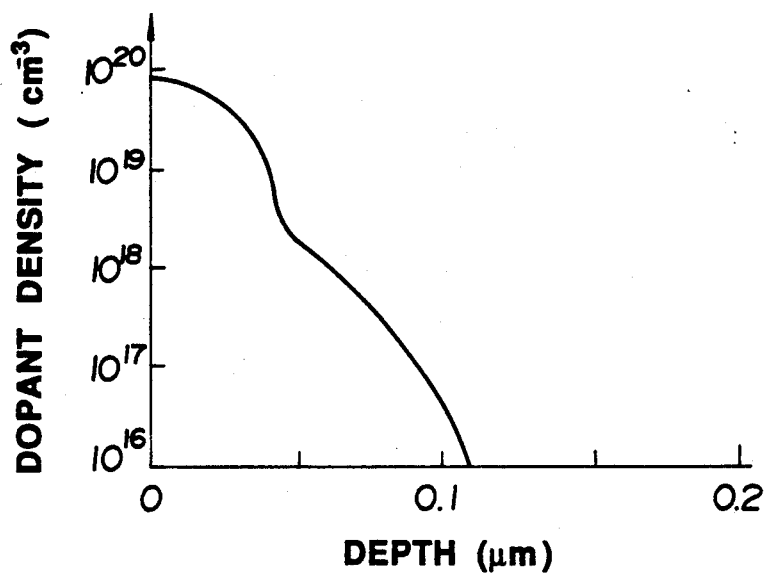
FIG. 2(a) is a graph illustrating the profile of impurities in the impurity diffusion layer of a MOSFET formed by the method shown in FIG. 1.
Figure 2B:
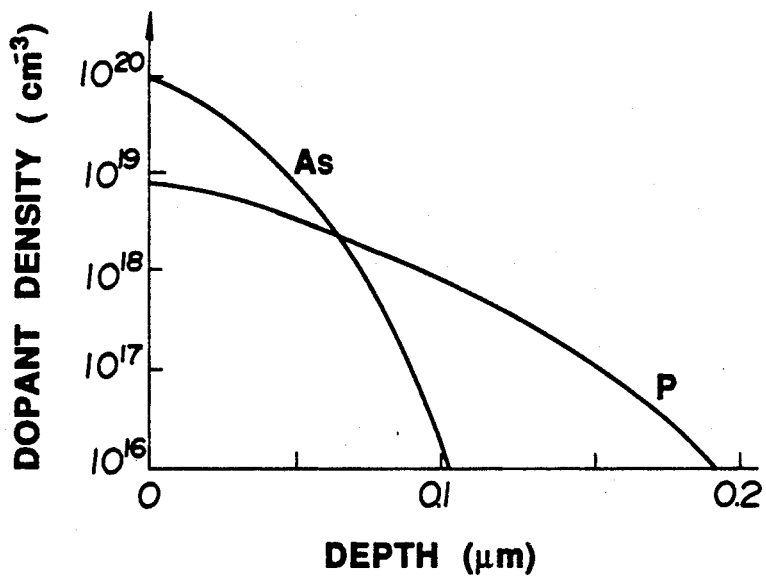
FIG. 2(b) is a graph illustrating the profile of impurities in the impurity diffusion layer of a MOSFET formed by a conventional method.

FIG. 2(a) shows the density profile of arsenic in the n⁻- and n⁺-diffusion layers formed thus. For comparison purposes, FIG. 2(b) shows the density profiles of phosphorus and arsenic in n⁻-diffusion layer (phosphorus) and in an n⁺-diffusion layer (arsenic) obtained when the phosphorus and arsenic are diffused from a silicon oxide layer containing phosphorus and arsenic to the silicon substrate by high speed heating at 1200° C. for 2 minutes using the conventional methods.

As will be obvious from the comparison, shallower n⁻- and n⁺-diffusion layers are formed according to the method of the inventive embodiment.

Figure 3:
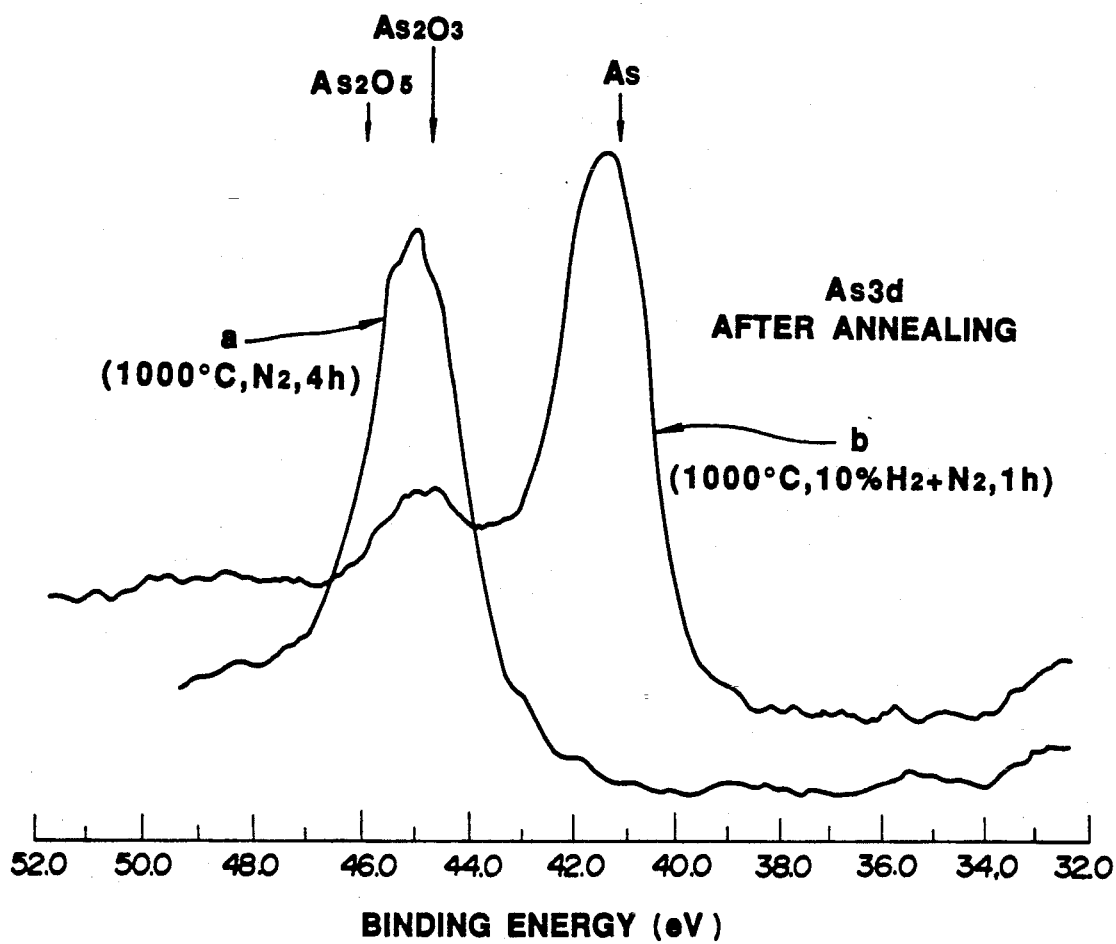
FIG. 3 is a graph illustrating the result of the measurement of chemical combination of arsenic in doped glass by an X-ray excited electron spectral analysis.

FIG. 3 shows the result of the measurement of the chemical states of arsenic atoms in the doped glass by an X-ray photoelectron spectrocopy (XPS). In FIG. 3, the axis of abscissas shows a binding energy. Curve a illustrates the chemical states of arsenic atoms when thermal treatment is conducted for 4 hours in a nitrogen atmosphere at 1000° C. while curve b illustrates the chemical states of arsenic atoms when thermal treatment is performed for one hour in a 10% hydrogen contained nitrogen atmosphere at 1000° C. As will be obvious from FIG. 3, arsenic remains oxidized in the case of the curve a while arsenic remains reduced in the case of the curve b.

While in the above embodiment the introduction of impurities into the silicon substrate has been described, the object into which impurities are diffused may be any one of a substrate other than the silicon substrate, a thin film, a single-crystal or polycrystalline layer substrate or an amorphous silicon layer or a semiconductor of other than silicon, of course.

While in the above embodiment the diffusion in the atmosphere containing hydrogen has been described, the place where diffusion is conducted is not limited to the atmosphere containing hydrogen as long as it is an atmosphere which can reduce desired impurities.

While in the above embodiment the formation of the diffusion layer having a step-like density profile using only arsenic as impurities has been described, materials other than arsenic may be used. Alternatively, combination of several kinds of impurities may be used.

The formation of a trench-type MOS capacitor of a HiC structure in a silicon substrate will be described as a second embodiment of the present invention.

FIGS. 4(a)–4(d) are procedural cross-sectional views illustrating the steps of forming a trench type MOS capacitor using the method according to another embodiment of the present invention.

Figure 4A:
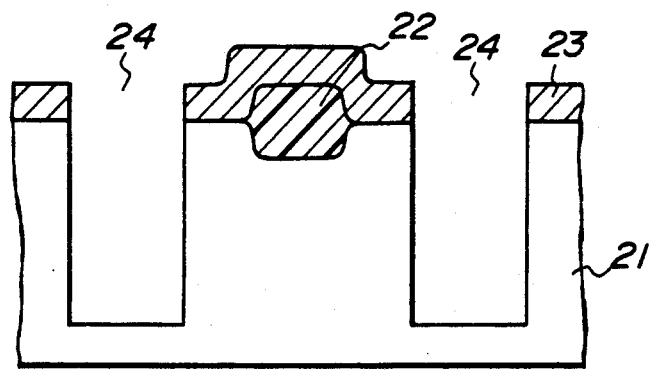
FIGS. 4(a)-4(d) illustrate the steps of fabricating a MOS capacitor according to the second embodiment of the present invention.

Referring to FIG. 4(a), an element separating insulating film 22 is formed in a p-type (100) silicon substrate 21 of a resistivity of 10 Ω· cm using conventional LOCOS. A silicon oxide layer 23 is then deposited as a mask used when grooves are formed. The resulting product is then patterned using photolithography and reactive ion etching processes and then grooves 24 are formed with the silicon oxide layer as the mask using an etching gas comprising carbon tetrachloride (CCl₄) as a main component.

Figure 4B:
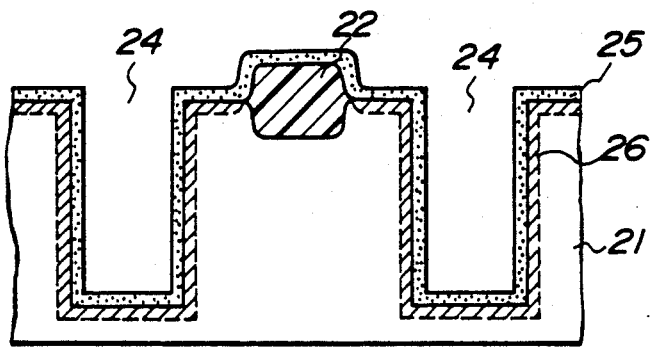

Thereafter, as shown in FIG. 4(b) the masking silicon oxide layer 23 is etched away with diluted hydrofluoric acid. Then, doped glass 25 of a thickness of 100 nm is deposited in which boron and arsenic are added at densities of $2 \times 10^{20}$ cm$^{-3}$ and $6 \times 10^{20}$ cm$^{-3}$, respectively, using low-pressure (LP)CVD. Heat treatment is conducted at 1000° C. for 60 minutes in a nitride atmosphere containing 10% of hydrogen in a conventional thermal diffusion furnace to reduce arsenic in the doped glass 25 to suppress the diffusion of arsenic in the doped glass and to diffuse only unreduced boron selectively from the doped glass to the silicon substrate to thereby form a p⁻-region 26 on the surface of the substrate.

Figure 4C:
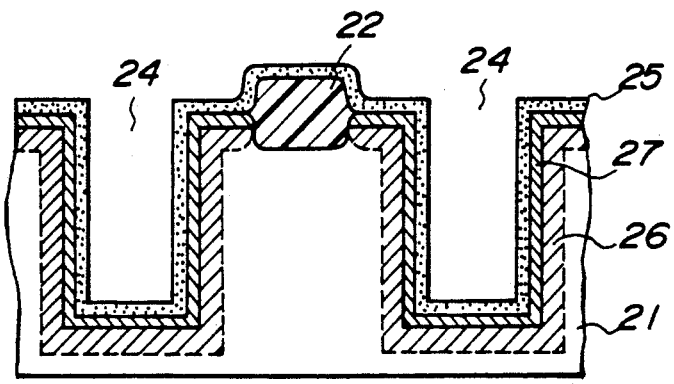

Further, as shown in FIG. 4(c), the temperature is changed to 900° C., a nitrogen atmosphere containing 10% of oxygen is selected to thereby put the arsenic in doped glass 25 in an easily oxidized diffused state. Thereafter, the temperature is raised to 1000° C., another nitrogen atmosphere is selected and thermal treatment is conducted for 30 minutes to thereby diffuse arsenic and boron simultaneously from the doped glass to the silicon substrate to form a doubled diffusion layer of n⁺-region 27 and p⁻-region 26.

Figure 4D:
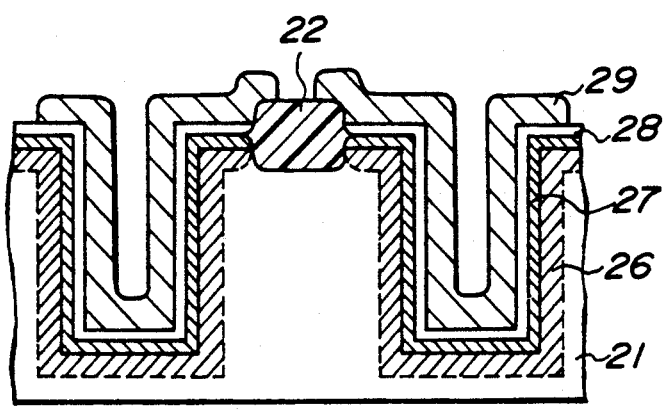

Further, as shown in FIG. 4(d), doped glass 25 to which arsenic and boron are added is etched away with diluted hydrofluoric acid, and then the resulting product is heated to 900° C. in a 50%-dry atmosphere in which argon gas is diluted to form a silicon oxide film 28 of a thickness of 10 nm as a capacitor insulating film. A plate electrode 29 of a polycrystalline silicon layer to which phosphorus is added is formed to complete the trench-type MOS capacitor.

Figure 5A:
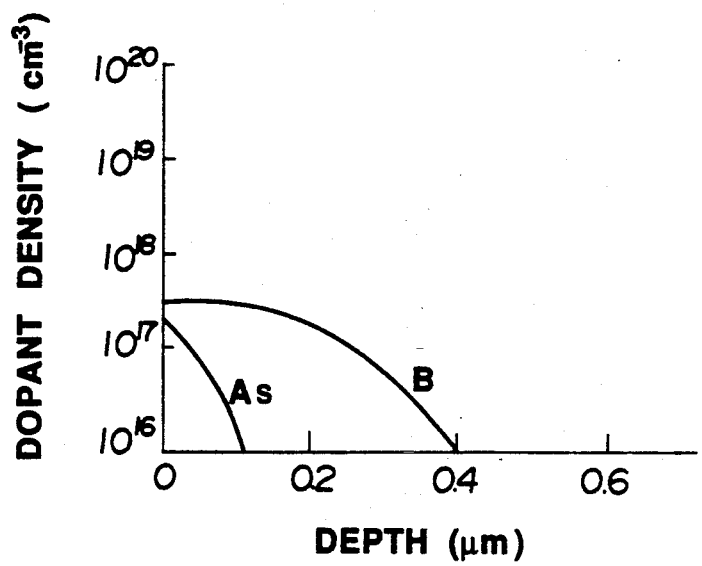
FIG. 5(a) is a graph illustrating the profile of impurities in the diffusion layer formed by the steps of FIG. 4(b)
Figure 5B:
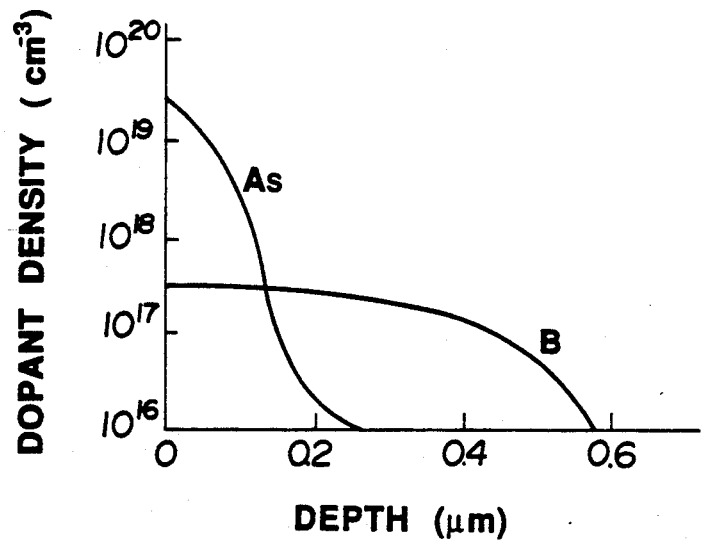
FIG. 5(b) is a graph illustrating the profile of impurities in the diffusion layer formed by the step shown in FIG. 4(c).

The resulting product is then subjected to thermal treatment at 1000° C. for 60 minutes in a nitrogen atmosphere containing 10% of hydrogen to reduce arsenic in doped glass 25 to suppress its diffusion into the doped glass and to selectively diffuse only boron from the doped glass into the silicon substrate (FIG. 4(b)). FIG. 5(a) shows the density profiles of arsenic and boron in the silicon substrate thus obtained. FIG. 5(b) shows the profiles of the dopant impurities thermally treated for 30 minutes (FIG. 4(c)) in the selected nitrogen atmosphere. It will be seen from the profiles of the impurities of FIG. 5(a) that the arsenic in doped glass 25 is reduced in the nitrogen atmosphere containing 10% of hydrogen and that the diffusion of arsenic is suppressed such that arsenic stays only within the doped glass and only boron is diffused selectively into the silicon substrate from the doped glass. It will also be seen from the profile of dopant impurities of FIG. 5(b) that arsenic is again oxidized by thermal treatment in an atmosphere containing oxygen, and thereafter arsenic and boron are together diffused into the silicon substrate 21 by thermal treatment in the nitrogen atmosphere to form an excellent double diffusion layer of n+-region 27 and a p--region 26.

It will be understood that by the inventive method a layer in which a plurality of kinds of dopant impurities are diffused in a complicated configuration is formed under a good control using simple processes.

In the foregoing description of this embodiment, the atmosphere to reduce the impurities, the atmosphere to oxidize the impurities, and the atmosphere to reduce no impurities are illustrated as being sequentially selected. However, the sequence of these processes is changeable when required.

Further, the thermal treatment in the respective atmospheres has been described as being conducted once. However, the thermal treatment may be conducted any desired number of times.

Furthermore, description has been made of changing an atmosphere in the same device. However, a different atmosphere device may be used each time a different atmosphere is selected.

A third embodiment of the present invention will now be described in which, as in the method of forming a trench type capacitor as in the second embodiment, a film as a source of diffusion comprises a double film of silicon glass layer 35a containing boron (PSG film: B-density=$6 \times 10^{19}$ atms/cm$^3$) 35a and a silicon glass layer (BAsSG film: B-density=$6 \times 10^{19}$ atms/cm$^3$, As-density=$5 \times 10^{20}$ atms/cm$^3$) 35b when a diffusion layer 36 is formed on the inner trench wall.

FIGS. 6(a)-6(d) are procedural cross-sectional views illustrating the steps of fabricating a trench type MOS capacitor using the method according to the inventive embodiment.

Figure 6:
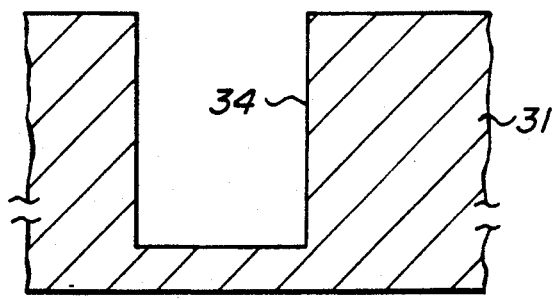
FIGS. 6(a)-6(d) illustrate the steps of fabricating a trench type MOS capacitor using a method according to the third embodiment of the invention.
Figure 6:
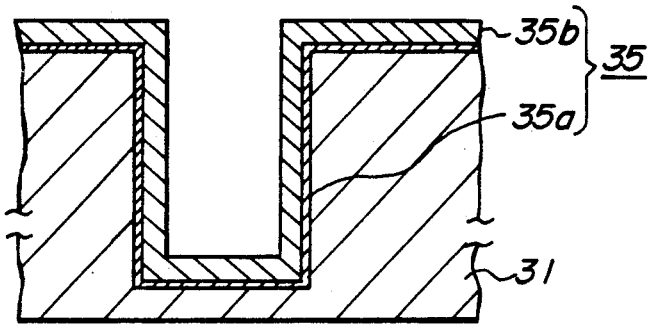
Figure 6:
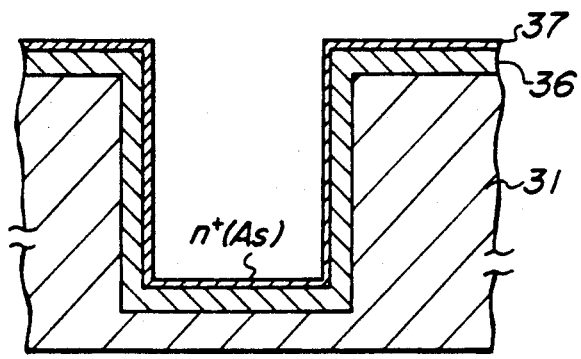
Figure 6:
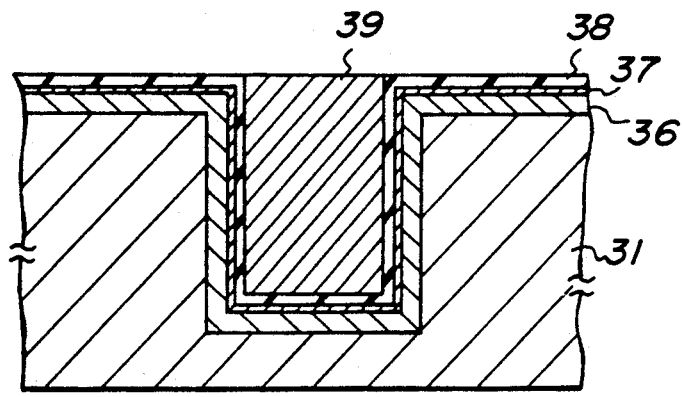

Referring to FIG. 6(a), a groove 34 is formed in a p-type (100) silicon substrate 31 of a resistivity of 10 Ω·cm using conventional methods.

Thereafter, as shown in FIG. 6(b), a source gas including TEOS (Tetraethoxy Silane) and TEB (Triethyl Borate) is used to form a BSG film 35a of a thickness of 3 nm. Thereafter, TEOA (Tetraethoxy Arsine) is added to the source gas to deposit a BAsSG film 35b to thereby form doped glass (an impurity containing film) 35 as the source of diffusion. The total film thickness is adjusted so as to be 100 nm.

A conventional thermal diffusion furnace is used to cause impurities to diffuse from doped glass 35 to silicon substrate 31. In order to suppress the diffusion of arsenic from the impurity containing film 35 while diffusing B, thermal treatment is performed at 900° C. for 60 minutes in an inertia gas containing 10% of hydrogen to reduce arsenic in doped glass 35. Thermal treatment is then performed at 1000° C. for 4 hours to cause unreduced boron to diffuse selectively from the doped glass into the silicon substrate to form a p--region 36.

As shown in FIG. 6(c), temperature is changed to 900° C., and a nitrogen atmosphere containing 10% of oxygen is selected such that the arsenic in doped glass 35 is put into an easily oxidized and diffused state. Thereafter, temperature is raised to 1000° C., a nitrogen atmosphere is selected and thermal treatment is conducted for 20 minutes to thereby cause arsenic and boron to diffuse simultaneously from the doped glass into the silicon substrate to thereby form a double diffusion layer of n+-region 37 and p--region 36. Thereafter, the doped glass 35 is etched away with a diluted hydrofluoric acid.

As shown in FIG. 6(d), the resulting product is heated to 900° C. in an atmosphere diluted with 50% of argon gas to form a silicon oxide film 38 of a thickness of 10 nm as the capacitor insulating film. A plate electrode 39 of a polycrystalline silicon layer to which phosphorus is added is deposited on the silicon oxide film 38 to thereby form a trench type MOS capacitor.

Figure 7A:
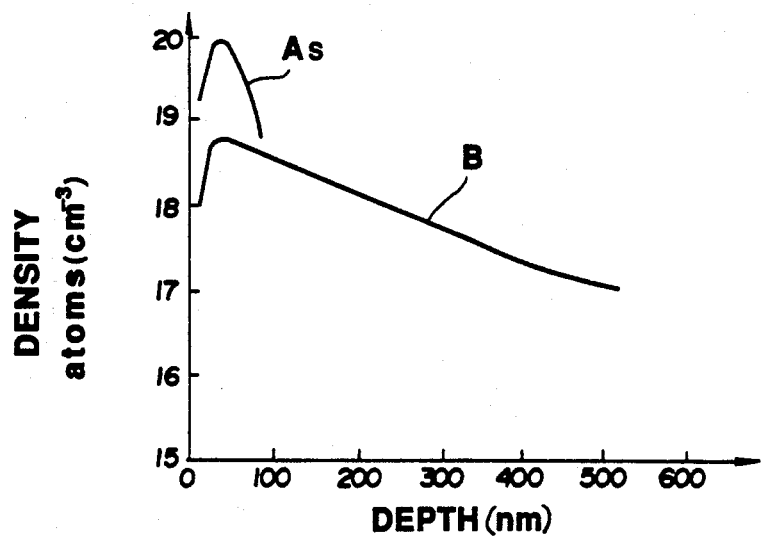
FIG. 7(a) is a graph illustrating the density profile of the diffusion layer of the trench type MOS capacitor according to the present invention.

The density profile of the diffusion layer of the MOS capacitor is shown in FIG. 7(a) which obviously shows an ideal profile in which B is diffused up to a deep depth of 500 nm while As is diffused only to a shallow depth of 80 nm.

Figure 7B:
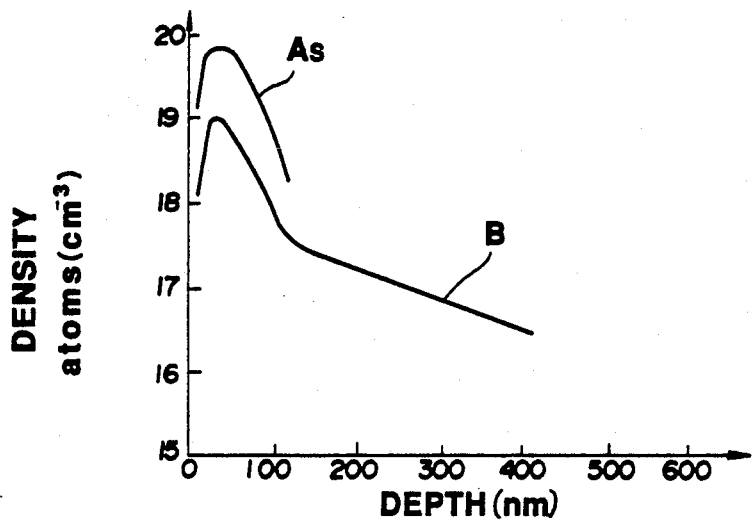
FIGS. 7(b) and 7(c) are graphs illustrating the corresponding density profiles of diffusion layers under two different control examples.

For comparison, FIG. 7(b) shows the density profile of a diffusion layer of a control example in which the film as the source of diffusion is formed of a single BAsSG film 35b and in which the remaining structure is exactly the same as the corresponding one of the MOS capacitor and in which exactly the same diffusion is performed. As will be obvious from FIG. 7(b), a sufficient diffusion depth of B cannot be obtained by a single BAsSG film 35b. If the diffusion time is increased in order to increase the diffusion depth of B, As would be diffused deeper than 100 nm from the surface, so that the difference in diffused depth between B and As would be reduced and ideal diffusion cannot be achieved.

Figure 7C:
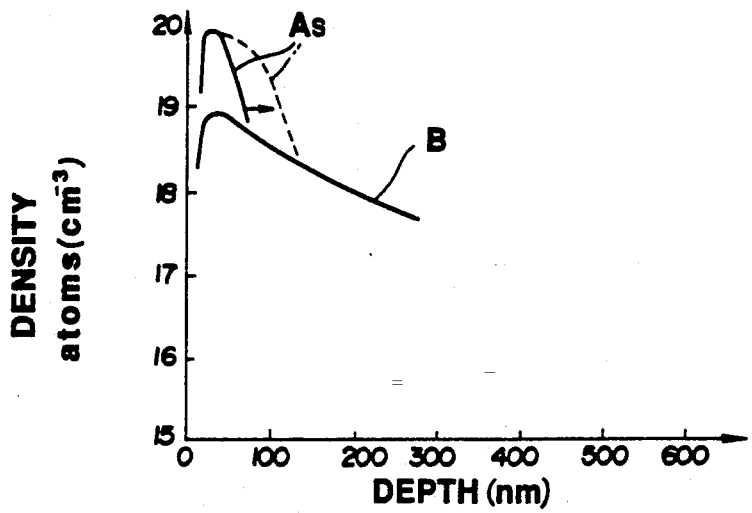

In the third embodiment, the arsenic in doped glass 35 was reduced, and thermal treatment was performed at 1000° C. for 4 hours. In contrast, FIG. 7(c) shows in a solid line the density profiles of the diffusion layer of a control example having exactly the same structure as the third embodiment and obtained by performing exactly the same processing as that used in the third embodiment except for the shortened thermal treatment of 2.5 hours. In the case of FIG. 7(c), it will be understood that only the diffusion depth of B can be reduced.

FIG. 7(c) also shows by broken line the density profile of a diffusion layer of a control example having the same structure as the control example of FIG. 7(b) and obtained by the same processing as that used in the control example of FIG. 7(b) except that the depth of the BSG film is 2 nm (the depth of the BSG film of FIG. 7(b) is 3 nm). In the case of FIG. 7(c), only the diffusion depth of As can be controlled deeply because the time required for As to arrive at the silicon substrate is reduced presumably.

It will be understood from the above that the respective diffusion depths of B and As impurities can be controlled independently by changing the time required for thermal treatment performed in the reducing atmosphere and the thickness of the BSG film.

While in the third embodiment the doped glass has been described as including a double-layered film of BAsSG and BSG films, it may include a double-layered film of AsSG and BSG films. The diffusion depth of the impurities can be controlled independently by forming the doped glass such that the density of at least one kind of impurity in the doped glass as the source of diffusion varies through the thickness of the doped glass and by adjusting the time required for the thermal treatment.

While the third embodiment has been described in the case of B and As, the present invention is applicable to combinations of other impurities such as P and Sb or even combinations of three or more kinds of impurities. The doped glass as the source of diffusion may be not only a double film but also a multi-layered film including triple- or more-layered film.

It will be understood that the inventive methods forms a diffusion layer of a plurality of dopant impurities and having a complicated configuration under good control while performing simple processes.

A method of fabricating a MOS FET according to a fourth embodiment of the present invention will be described.

Figure 8A:
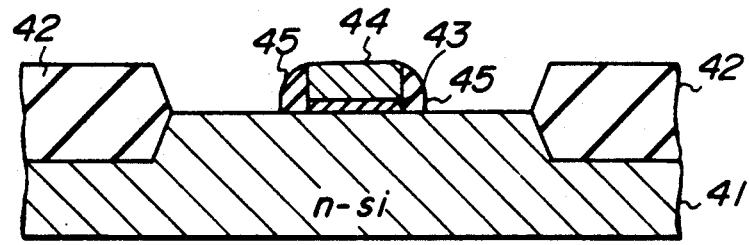
FIGS. 8(a)-8(d) illustrate the steps of fabricating a MOSFET according to the fourth embodiment of the present invention.

Referring to in FIG. 8(a), an element separating insulating film 42 is formed in an n-type silicon substrate 41 of a resistivity of 10Ω·cm using convention LOCOS. A silicon oxide layer of a thickness of 10 nm and a polycrystalline silicon film of a thickness of 300 nm are deposited by thermal oxidization. The resulting product is then patterned using photolithography and reactive ion etching to thereby form a gate insulating film 43 and a gate electrode 44. Thereafter, a silicon oxide film 45 is deposited using CVD. Silicon oxide film 45 is then patterned using side wall leaving techniques which include anisotropic etching such that silicon oxide film 45 remains only on the sidewall of gate electrode 44.

Figure 8B:
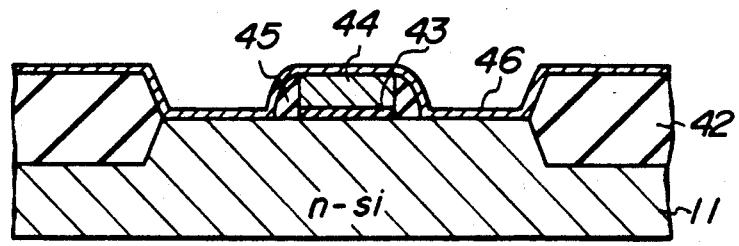

Thereafter, as shown in FIG. 8(b), a doped glass (BSG film) 46 of a thickness of 100 nm is deposited to which B is added at density of $5 \times 10^{21}$ cm$^{-3}$ using CVD.

Figure 8C:
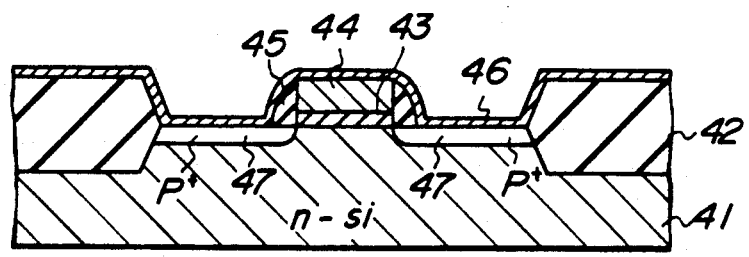
Figure 8D:
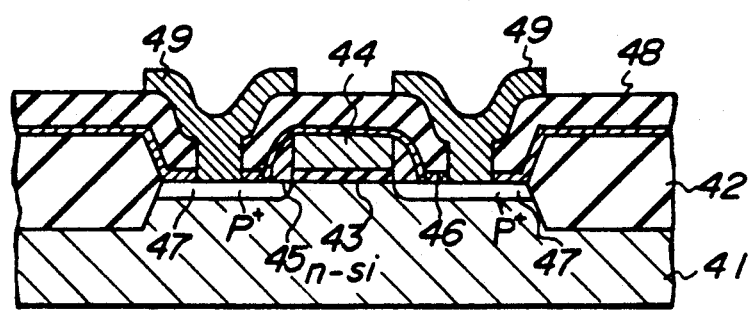

As shown in FIG. 8(c), thermal treatment is performed at 900° C. for 30 minutes in a nitrogen atmosphere containing 10% of hydrogen. Thus, boron in BSG film 46 is thermally diffused into silicon substrate 41 to form a p-type impurity diffusion layer 47 which will become a source-drain region having a very shallow junction depth on the order of 0.15 μm and having an impurity density on the order of $10^{21}$ cm$^{-3}$ in silicon substrate 41 on either side of gate electrode 44. At the same time, boron in BSG film 46 is diffused into the gate electrode 44 to thereby change same to a low-resistance p-type silicon film. If the temperature of the thermal treatment is excessively low, diffusion is insufficient to thereby achieve no desired impurity density whereas if the temperature is excessively high, the diffusion cannot be performed under good control, so that the practical temperature range used is preferably about 700°–1100° C.

Thereafter, inter-layer insulating film 48 is deposited, wiring contact holes are formed, electrode leads 49 are formed using a metal such as aluminum or molybdenum to complete a p-channel type MOS transistor.

While it was described that in the above embodiment boron was diffused from BSG film 46 and that BSG film 46 remained, BSG film 46 may be etched away with hydrofluoric acid and inter-layer insulating film 48 may then be formed.

Figure 9:
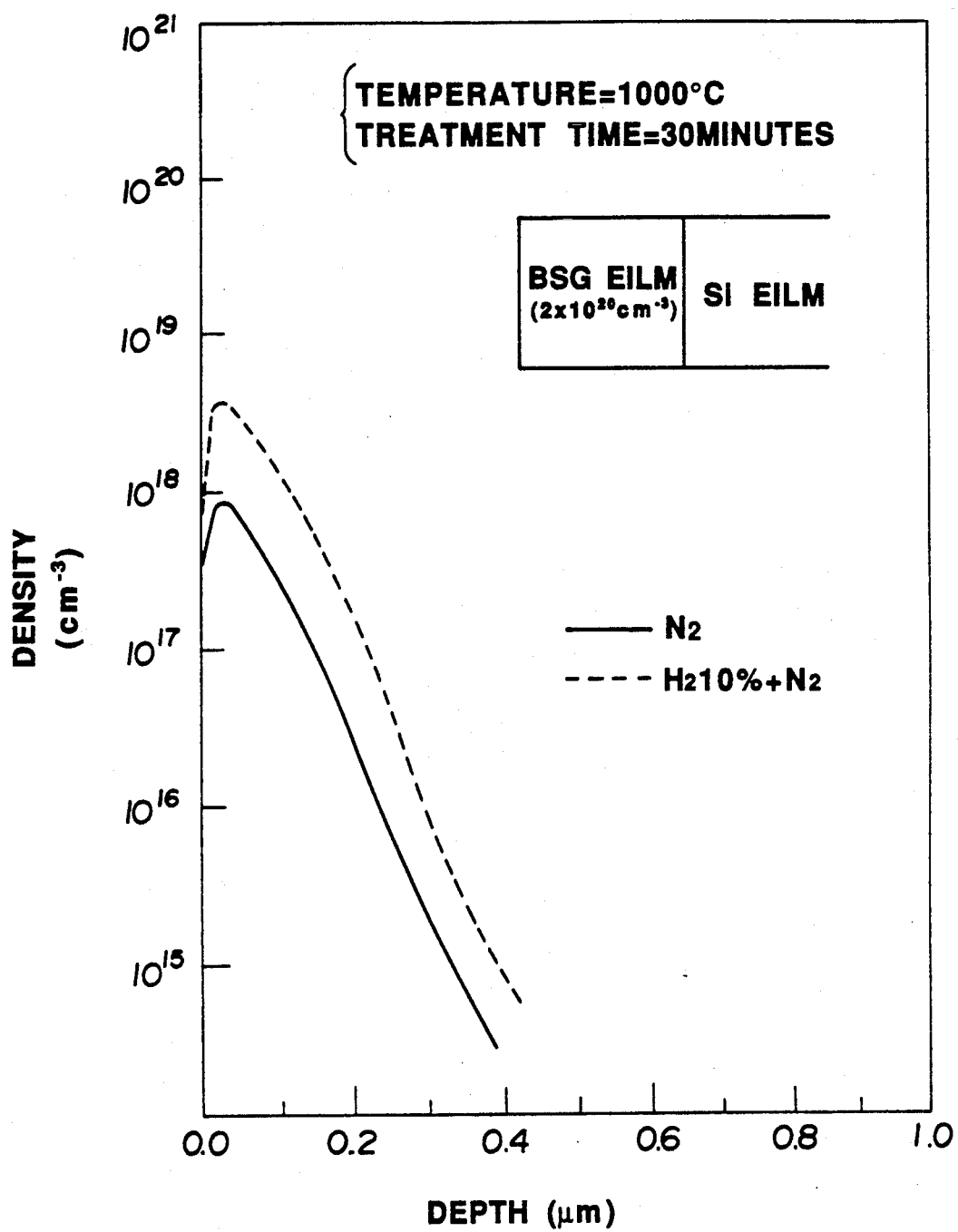
FIG. 9 is a graph illustrating the respective density profiles of diffusion layers of the MOSFET under different atmospheres.

FIG. 9 shows, in broken line, the profile of the impurity density of the diffusion layer thus formed. For comparison, FIG. 9 also shows, in solid line, the profile of the impurity density of the diffusion layer of a control example obtained by diffusion in a nitrogen atmosphere containing no hydrogen. As will be obvious from this comparison, the inventive method is capable of forming a shallow, high concentration diffusion layer under good control.

While in the above embodiments the diffusion atmosphere of nitrogen which contains hydrogen has been described as being used, an inertia gas such as argon or helium containing hydrogen may be used. The hydrogen containing density is, preferably, 2–60%, more preferably, 5–40%, and, still more preferably, 5–20%. If the density is 5–20%, the segregation coefficient is increased especially. If the density is less than 2%, it takes much time to form a desired junction layer, which is not practical. If the density is higher than 60%, the atmosphere is very likely to be exploded by heat generated during diffusion, which is very dangerous.

What is claimed is:
1. A method of fabricating a semiconductor device, comprising the steps of:
   forming a silicon oxide layer on a surface of a semiconductor layer, the silicon oxide layer containing impurities;
   reducing the impurities in the silicon oxide layer at a first temperature; and
   diffusing the impurities in the silicon oxide layer into the surface of the semiconductor layer at a second temperature,
   wherein the first temperature is lower than the second temperature.

2. A method of fabricating a semiconductor device, comprising the steps of:
   forming a silicon oxide layer on a surface of a semiconductor layer, the silicon oxide layer containing impurities;
   reducing the impurities in the silicon oxide layer at a first temperature;
   diffusing the impurities in the silicon oxide layer into the surface of the semiconductor layer at a second temperature;
   oxidizing any impurities remaining in the silicon oxide layer at a third temperature; and
   diffusing the impurities remaining in the silicon oxide layer into the surface of the semiconductor layer at the second temperature,
   wherein both the first temperature and the third temperature are lower than the second temperature.

3. A method of fabricating a semiconductor device, comprising the steps of:
   forming a silicon oxide layer on a surface of a semiconductor layer, the silicon oxide layer containing a plurality of types of impurities;
   reducing a specific type of the impurities in the silicon oxide layer at a first temperature; and
   diffusing the plurality of types of impurities in the silicon oxide layer into the surface of the semiconductor layer at a second temperature,
   wherein the first temperature is lower than the second temperature.

4. A method of fabricating a semiconductor device, comprising the steps of:
   forming a silicon oxide layer on a surface of a semiconductor layer, the silicon oxide layer containing first and second types of impurities;
   exposing the silicon oxide layer to a reducing atmosphere and reducing the first type of impurity so as to bring the first type of impurity into a state difficult to diffuse;
   diffusing impurities other than the first type of impurity into the semiconductor layer;
   exposing the silicon oxide layer to an oxidizing atmosphere to oxidize the first type of impurity in the silicon oxide layer so as to return the first type of impurity into a state easy to diffuse; and
   diffusing the first and second types of impurities into the semiconductor layer.

5. A method of fabricating a semiconductor device according to claim 4, wherein the reducing step comprises a step of heating the silicon oxide layer in a reducing atmosphere to a predetermined temperature, and the reducing step and the step of diffusing impurities other than the first type of impurity are simultaneously performed.

6. A method of fabricating a semiconductor device, comprising the steps of:
   forming a first silicon oxide layer on a surface of a semiconductor layer, the first silicon oxide layer containing at least a first type of impurity;
   forming a second silicon oxide layer on the first silicon oxide layer, the second silicon oxide layer containing at least a second type of impurity;
   exposing the silicon oxide layers to a reducing atmosphere to reduce the first type of impurity so as to bring the first type of impurity into a state difficult to diffuse;
   diffusing impurities other than the first type of impurity into the semiconductor layer;
   exposing the silicon oxide layers to an oxidizing atmosphere to oxidize the first type of impurity in the silicon oxide layer so as to return the first type of impurity into a state easy to diffuse; and
   diffusing the first and second types of impurities into the semiconductor layer.

7. A method of fabricating a MOSFET, comprising the steps of:
   forming a gate electrode on the surface of a substrate;
   forming a silicon oxide layer on the substrate such that the silicon oxide layer contacts regions designated for forming source and drain regions, the silicon oxide layer including first and second types of impurities of the same conductivity type;
   exposing the silicon oxide layer to a reducing atmosphere to reduce the first type of impurity so as to bring the first type of impurity into a state difficult to diffuse;
   diffusing the second type of impurity into the semiconductor layer;
   exposing the silicon oxide layer to an oxidizing atmosphere to oxidize the first type of impurity in the silicon oxide layer so as to return the first type of impurity to a state easy to diffuse;
   diffusing the first and second types of impurities into the semiconductor layer, thereby forming source and drain regions including a first diffusion layer containing the first and second types of impurities at a high density, and a second diffusion layer of the same conductivity type formed around the first diffusion layer and containing the first type of impurity at a low density.

8. A method of fabricating a semiconductor device of a trench type capacitor structure, comprising the steps of:
   forming a trench in the surface of a semiconductor substrate;
   forming on an inner wall of the trench a first silicon oxide layer containing at least a first type of impurity;
   forming a second silicon oxide layer on the first silicon oxide layer, the second silicon oxide layer containing at least a second type of impurity having a conductivity opposite that of the first type of impurity;
   exposing the first silicon oxide layer to a reducing atmosphere to reduce the first type of impurity in the first silicon oxide layer so as to bring the first type of impurity into a state difficult to diffuse;
   diffusing impurities other than the first type of impurity into the semiconductor layer;
   exposing the first silicon oxide layer to an oxidizing atmosphere to oxidize the first type of impurity in the first silicon oxide layer so as to return the first type of impurity to a state easy to diffuse;
   diffusing the first and second types of impurities into the semiconductor layer, thereby forming a trench type capacitor storage node comprising a first diffusion layer of one conductive type on the inner wall of the trench, which first diffusion layer includes the first type of impurity at a high density, and a second diffusion layer around the first diffusion layer, which second diffusion layer includes the second type of impurity;
   forming a capacitor insulating film on the storage node; and
   forming a plate electrode on the capacitor insulating film.

9. A method of fabricating a semiconductor device according to claim 1, wherein the first temperature is 900° C. and the second temperature is 1000° C.

10. A method of fabricating a semiconductor device according to claim 2, wherein the first temperature is 900° C. and the second temperature is 1000° C.

11. A method of fabricating a semiconductor device according to claim 1, wherein the reducing step includes a step of conducting thermal treatment in a gaseous atmosphere containing hydrogen.

12. A method of fabricating a semiconductor device according to claim 11, wherein the reducing step includes a step of conducting thermal treatment in a gaseous atmosphere containing 2-60% of hydrogen.

13. A method of fabricating a semiconductor device according to claim 11, wherein the reducing step includes a step of conducting thermal treatment in a gaseous atmosphere containing 5-20% of hydrogen.

14. A method of fabricating a semiconductor device according to any one of claims 4 and 5, wherein the first type of impurity is arsenic (As) and the second type of impurity is boron (B).

15. A method of fabricating a semiconductor device according to any one of claims 4 and 5, wherein the first type of impurity is antimony (Sb) and the second type of impurity is phosphorus (P).

16. A method of fabricating a semiconductor device according to claim 6, wherein the first type of impurity is arsenic (As) and the second type of impurity impurity is boron (B).

17. A method of fabricating a semiconductor device according to claim 6, wherein the first type of impurity is antimony (Sb) and the second type of impurity is phosphorus (P).

* * * * *